(12) United States Patent
Cali et al.

(10) Patent No.: US 9,748,961 B2
(45) Date of Patent: Aug. 29, 2017

(54) SINGLE CYCLE ASYNCHRONOUS DOMAIN CROSSING CIRCUIT FOR BUS DATA

(71) Applicant: BAE Systems Information and Electronic Systems Integration Inc., Nashua, NH (US)

(72) Inventors: Joseph D. Cali, Nashua, NH (US); Lawrence J. Kushner, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/099,757

(22) Filed: Apr. 15, 2016

(65) Prior Publication Data

US 2016/0226502 A1 Aug. 4, 2016

Related U.S. Application Data

(63) Continuation-in-part of application No. 14/968,180, filed on Dec. 14, 2015, now Pat. No. 9,479,185.

(60) Provisional application No. 62/148,255, filed on Apr. 16, 2015, provisional application No. 62/091,042, filed on Dec. 12, 2014.

(51) Int. Cl.
*H03L 7/197* (2006.01)
*H03M 7/30* (2006.01)

(52) U.S. Cl.
CPC .......... *H03L 7/1974* (2013.01); *H03L 7/1976* (2013.01); *H03M 7/3033* (2013.01)

(58) Field of Classification Search
CPC ... H03L 7/1976; H03L 7/1974; H03L 7/3033; H03L 7/197
See application file for complete search history.

(56) References Cited

U.S. PATENT DOCUMENTS

| 6,738,442 | B1* | 5/2004 | Wilcox | H03K 5/135 327/142 |
|---|---|---|---|---|
| 7,230,461 | B1* | 6/2007 | Savoj | H03L 7/183 327/156 |
| 8,115,519 | B2 | 2/2012 | Turner | |
| 8,155,256 | B2* | 4/2012 | Staszewski | H03L 7/085 370/337 |
| 8,169,348 | B2* | 5/2012 | Tsunoda | H03M 9/00 341/100 |

(Continued)

*Primary Examiner* — Thomas J Hiltunen
(74) *Attorney, Agent, or Firm* — Finch & Maloney PLLC; Scott J. Asmus

(57) ABSTRACT

Techniques are disclosed for managing the timing between two asynchronous clocks. The techniques are particularly well-suited for synchronizing the reference clock with the divided clock in a phase coherent DSM PLL application, but can be more broadly applied to any application that includes a need for synchronizing a data bus across a clock boundary. In one example embodiment, the techniques are implemented in a retime word circuit operatively coupled between a DSM and the divide-by-N integer divider of a PLL application. The retime word circuit receives the divide word from the DSM and generates a retimed divide word that can be applied to the divider. The retime word circuit maintains the reference clock frequency throughout, and forces the divide word seen by the divider to change only at end of a given divide cycle.

18 Claims, 3 Drawing Sheets

(56) References Cited

U.S. PATENT DOCUMENTS

| | | | |
|---|---|---|---|
| 8,428,207 B1 * | 4/2013 | Dally | H04L 7/0012 375/354 |
| 8,664,990 B2 | 3/2014 | Turner et al. | |
| 8,766,681 B2 * | 7/2014 | Fortier | G06F 1/24 327/147 |
| 8,836,394 B2 * | 9/2014 | Zerbe | H04L 7/0079 326/82 |
| 8,952,736 B1 * | 2/2015 | Evans | H03L 7/1974 327/147 |
| 8,964,919 B2 * | 2/2015 | Tell | H04L 7/0012 375/354 |
| 9,208,844 B1 * | 12/2015 | Lamb | G11C 11/4093 |
| 2016/0156364 A1 * | 6/2016 | Chen | H03K 21/023 327/115 |

\* cited by examiner

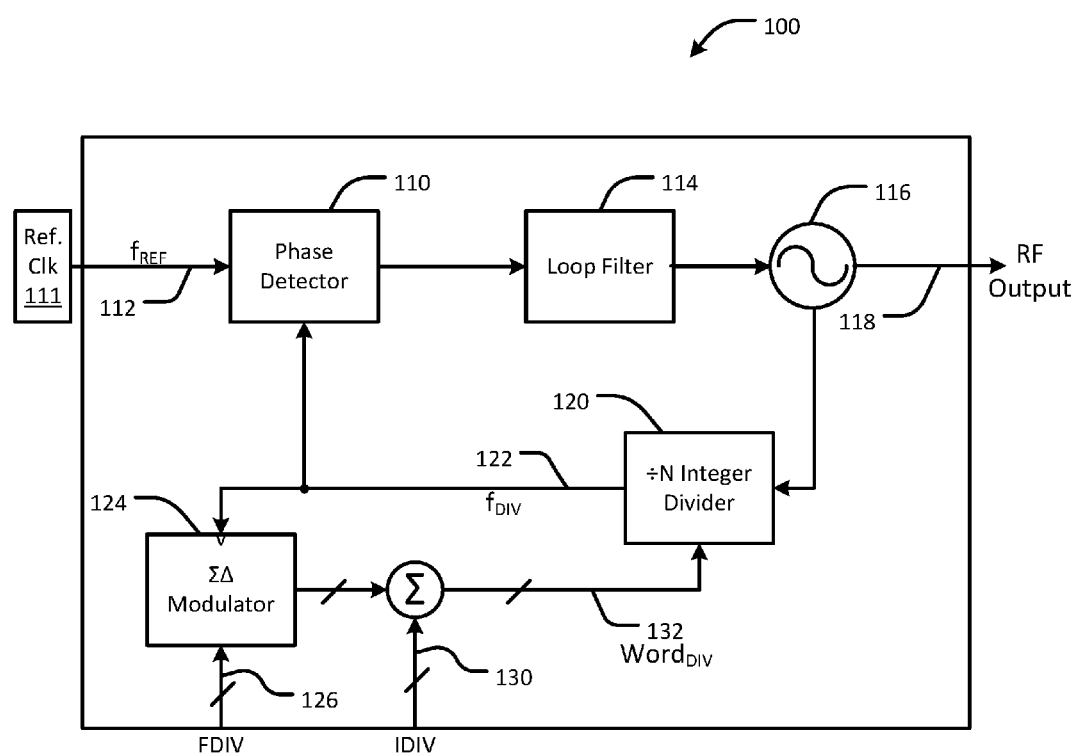
Fig. 1
(Conventional)

SINGLE CYCLE ASYNCHRONOUS DOMAIN CROSSING CIRCUIT FOR BUS DATA

RELATED APPLICATION

This application claims the benefit of U.S. Provisional Application No. 62/148,255 filed on Apr. 16, 2015. In addition, this application is a continuation-in-part of U.S. patent application Ser. No. 14/968,180 filed Dec. 14, 2015, which claims the benefit of U.S. Provisional Patent Application Ser. No. 62/091,042, filed Dec. 12, 2014. Each of these applications is herein incorporated by reference in its entirety.

STATEMENT OF GOVERNMENT INTEREST

The invention was made with United States Government support under Contract No. HR0011-12-C-0083 awarded by Defense Advanced Research Projects Agency (DARPA). The United States Government has certain rights in this invention.

FIELD OF THE DISCLOSURE

This disclosure relates generally to techniques for managing the timing between two asynchronous clocks, and more particularly to a single cycle asynchronous domain crossing circuit for bus data.

BACKGROUND

Fractional-N phase-locked loops (PLLs) can be used for synthesizing frequencies at a non-integer scalar frequency of an input reference signal. Phase coherent means that the phase relationship between the input reference signal and the output signal is deterministic. However, it has been found in existing fractional-N PLLs that when the PLL tunes away from one frequency to another frequency and returns to the original frequency, the relationship between the phase of the output signal and the phase of the input reference signal is not phase coherent. In other words, when changing from a frequency A to a frequency B and then back to the frequency A signal, the phase of the frequency A signal is not necessarily matched to that of the previously generated frequency A signal. Further, with existing fractional-N PLLs, the phase difference between an originally-generated frequency A signal and a subsequently-generated frequency A signal may be significantly more than a rounding error of a few degrees. In fact, the phase can be any phase, 0 to 360 degrees, based on the fractional part of the divide word. If the fraction is 0.25, there are 4 possible phases. If the fraction is 0.1, there are 10 possible phases, etc. In fractional-N PLL architectures, a delta-sigma modulator (DSM) can be used to generate a sequence that enables fractional reference frequency tuning of a voltage-controlled or digitally-controlled oscillator.

The DSM reduces the magnitude of fractional spurs near the PLL carrier in comparison to single accumulator fractional-N PLLs. For phase coherency, the PLL should return to the same phase relative to the PLL reference. However, DSMs may have hidden states that cause the PLL to return to a random phase relative to the reference when tuning away from a frequency and back again. This occurrence may break phase coherency. Phase coherency is particularly important when considering multiple instances of the frequency synthesizers in a given system. In a conventional fractional-N PLL, the DSM (sometime designated as ΣΔ modulator) is clocked off the divided waveform. The modulus control to the loop divider should only change when a divide cycle is complete. To this end, the edge of the divided waveform generally denotes a time when the loop divider has finished a divide cycle. Because there is a fixed time relationship between the finishing of a divide and the update of the divide word, phase coherence is maintained. Difficulties can arise, however, when the DSM is not clocked off the divided waveform.

BRIEF DESCRIPTION OF THE DRAWINGS

FIG. 1 illustrates a block diagram of a typical fractional-N delta-sigma modulator phase-locked loop.

DETAILED DESCRIPTION

Figure 2:
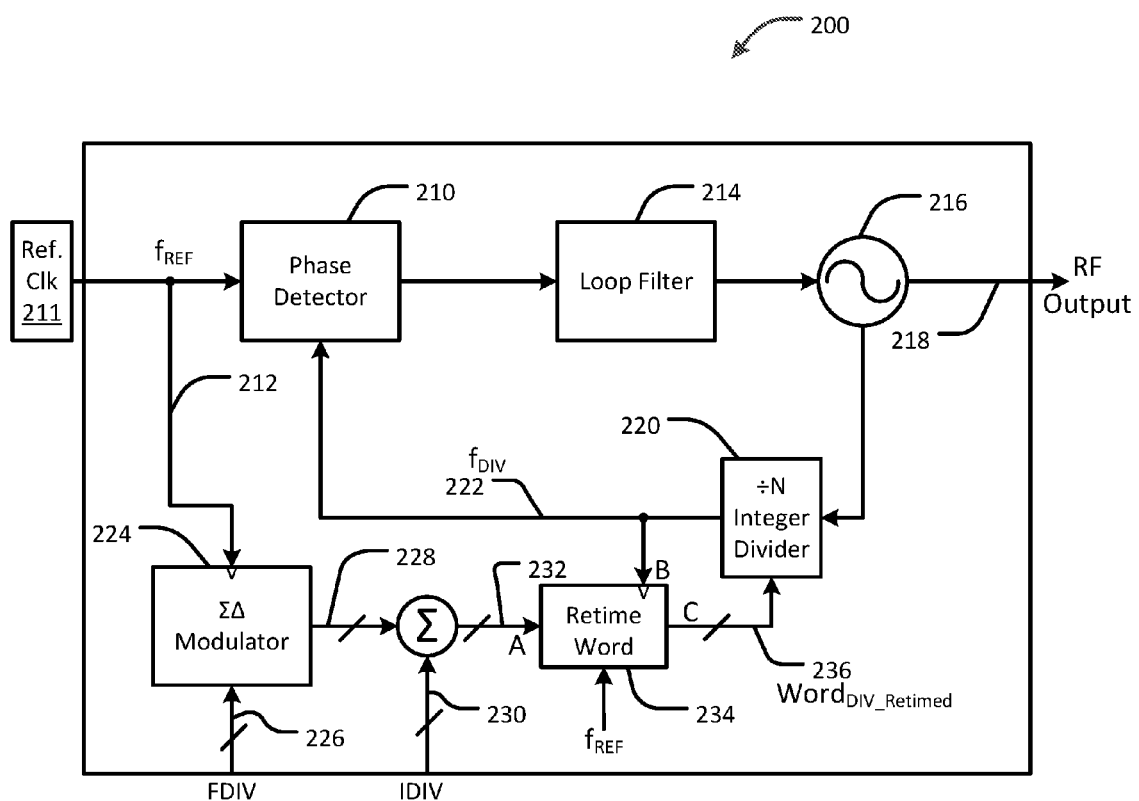
FIG. 2 illustrates a block diagram of a fractional-N phase-locked loop that utilizes a phase coherent delta-sigma modulator for maintaining phase coherence between a synthesized clock and a reference clock, in accordance with an embodiment of the present disclosure.

Techniques are disclosed for managing the timing between two asynchronous clocks. The techniques are particularly well-suited for synchronizing the reference clock with the divided clock in a phase coherent delta-sigma modulator (DSM) PLL application, but can be more broadly applied, for instance, to any application that includes a need for synchronizing a data bus across a clock boundary, as will be appreciated in light of this disclosure. In one example embodiment, the techniques are implemented in a retime word circuit operatively coupled between a DSM and the divide-by-N integer divider of a PLL application. The retime word circuit receives the divide word from the DSM and generates a retimed divide word that can be applied to the divider. The retime word circuit maintains the reference clock frequency throughput, and forces the divide word seen by the divider to change only at end of a given divide cycle. In a more general sense, the techniques may be used, for example, for any data bus crossing a clock domain boundary, not just a sigma-delta data bus in a PLL, as will be further appreciated.

General Overview

As previously explained, a typical fractional-N DSM PLL is clocked off the divided waveform, such that there is a fixed time relationship between the finishing of a divide and the update of the divide word. This fixed relationship allows phase coherence to be readily maintained. FIG. 1 shows a typical fractional-N DSM PLL circuit 100. As can be seen, the circuit 100 includes a phase detector 110 provided with a reference frequency 112 by a reference clock 111. The output of the phase detector 110 is coupled to a loop filter 114 and then to a voltage-controlled oscillator 116, which forms a phase-locked loop output 118. The phase-locked loop output 118 is fed back to the phase detector 110 through a divide-by-N integer divider 120. Switching of the divider 120 is controlled by a DSM 124. The DSM 124, which is clocked off the divided waveform ($f_{DIV}$ 122) from the divider 120, is provided with a fractional divide control number 126. In addition, the output of the DSM 124 is summed with an integer divide control number 130. Thus, the frequency divide word (Word$_{Div}$) 132 is made up of an integer portion plus a fraction portion. In a phase coherent PLL that uses a phase coherent DSM, such as the one described in the previously incorporated U.S. patent application Ser. No. 14/968,180, the DSM 124 is clocked off the reference clock ($f_{REF}$ 112), rather than off the divided waveform ($f_{DIV}$ 122) from the divider 120. However, there is an asynchronous relationship between the reference clock 111 ($f_{REF}$ 112) changing the divide word (Word$_{Div}$ 132) and the divided clock ($f_{DIV}$ 122) indicating that the divider 120 has finished its cycle. If the divide word 132 changes at an incorrect time, then the divider 120 will divide by an incorrect word. Such a scenario can cause the PLL to lose (or never obtain lock).

Thus, techniques are provided herein for managing the timing between two asynchronous clocks. The techniques are particularly well-suited for synchronizing the reference clock with the divided clock in a phase coherent DSM PLL application, but can be more broadly applied, for instance, to any application that includes a single cycle asynchronous domain crossing circuit for bus data or a need for synchronizing a data bus across a clock boundary. In one example embodiment, the techniques are implemented in a retime word circuit operatively coupled between a DSM and the divide-by-N integer divider of a PLL application. The retime word circuit receives the divide word from the DSM and generates a retimed divide word that can be applied to the divider. The retime word circuit maintains the reference clock frequency throughput, and forces the divide word seen by the divider to change only at end of a given divide cycle.

According to one embodiment of the present disclosure, the retime word circuit includes two register banks that capture data from the DSM. One of the register banks captures at the rising edge of the reference clock, and the other captures at the falling edge of the reference clock. For purposes of discussion, it is assumed that the data of the DSM changes at the rising edge of the reference clock. Other embodiments may be configured such that the DSM changes at the falling edge of the reference clock. In such cases, an extra bank of registers could be added immediately after the DSM to fix the timing. It is further assumed that the reference clock is at or otherwise sufficiently close to a 50% duty cycle. In some embodiments, a single D-type flip-flop (DFF) is used to sample the state of the reference clock. If the DFF output is a logical 1 (HI), then the positive-edge triggered capture bank is selected. This is because the negative-edge triggered bank could change at any time. If the DFF output is a logical 0 (LOW), then the negative-edge triggered capture bank is selected. This is because the positive-edge triggered bank could change at any time.

If the reference clock and divided clock are at such a phase that the DFF goes into a meta-stable region (where it is difficult to discern which clock is leading/lagging), then it can be assumed that a capture event has just occurred (although it is not known which one). By adding a sufficient delay on the divided clock line to the divide word capture bank, the set-up time available for that bank can be determined by $t_{ref}/2-t_{del}$. For reasonable reference clock frequencies (e.g., 10 KHz to 100 GHz), such delay should be sufficient. In a more general sense, the delay on the divided clock line can be tailored to a given range of clock frequency. In some example cases, the delay can be determined through empirical testing using a set of known test parameters (e.g., $f_{REF}$, $f_{DIV}$, Word$_{Div}$, and retimed Word$_{Div}$).

In some embodiments, a high gain buffer is placed after the DFF to force a meta-stable event to a logic rail (e.g., CMOS logic rail, depending on the process technology), when neither the reference clock nor the divided clock is discernibly leading or lagging. Other embodiments may use voting logic and multiple DFFs to make a more robust decision and eliminate the ambiguity created by such meta-stability events. Any such configurations can be used in conjunction with the techniques provided herein. In any case, note selecting either of the positive-edge triggered capture bank or the negative-edge triggered bank will both yield a proper divider, given the relatively close phase relationship between the reference clock and the divider clock (during a meta-stabile event).

Phase Coherent Fractional-N DSM PLL Circuitry

FIG. 2 shows an fractional-N phase-locked loop (PLL) 200 that utilizes a phase coherent DSM for maintaining phase coherence between a synthesized clock and a reference clock, in accordance with an embodiment of the present disclosure. The PLL 200 includes a phase detector 210 provided with a reference frequency 212 by a reference clock 211. The output of the phase detector 210 is coupled to a loop filter 214 and then to a voltage-controlled oscillator (VCO) 216, which forms a phase-locked loop output 218. The phase-locked loop output 218 (sometimes also referred to as an output frequency or tone) is fed back to the phase detector 210 through a divide-by-N integer divider 220.

Switching of the divider 220 is still generally controlled by a DSM 224. However, the resulting divide word is retimed by an intervening retime word circuit 234. The DSM 124, which is clocked off the reference clock ($f_{REF}$ 212) from the reference clock 211, is provided with a fractional divide control number 226. In addition, the output of the DSM 224 is summed with an integer divide control number 230. Thus, the frequency divide word (Word$_{Div}$) 232 is made up of an integer portion plus a fraction. The integer portion is fixed, while the DSM 124 generates the fraction by dithering between a number of values (which will vary depending of the given application). The DSM generates a randomized pattern with an average equal to the desired fraction. By randomizing the fraction, rather than going through a fixed sequence, spurious tones are avoided, in exchange for an increased noise floor. The noise floor is increased out at high frequency offsets, where this noise will be filtered out by the PLL loop filter. A synchronous reset pulse is used to initialize the state of the PLL. Additional information about fractional-N PLLs can be found, for example, in U.S. Pat. No. 8,664,990, which is herein incorporated by reference in its entirety, and discloses a fractional-N phase-locked loop (PLL) in which the frequency control word multiplies by the output of a reference counter to provide the carry bit utilized in n/n+1 switching.

The retimed word circuit 234 receives the divide word 232, along with the reference clock ($f_{REF}$ 212) and divided clock ($f_{DIV}$ 222) and generates a retimed divide word (Word$_{Div\_Retimed}$ 236). Before the PLL 200 reaches lock, the reference clock domain and feedback divider clock domain are asynchronous, do not share a known phase relationship, and do not operate at the same frequency. When a new frequency plan is selected for the PLL, the feedback frequency $f_{DIV}$ 222 will change while the reference frequency $f_{REF}$ 212 remains the same. During this period, the retime word circuit 234 ensures that the fractional divide word 232 of the DSM 224 is correctly received by a loop divider 220. The loop divider 220 in the feedback clock ($f_{DIV}$ 222) domain receives retimed divide words 236 generated by the DSM from the reference clock domain ($f_{REF}$ 212). The retimed word circuit 234 will be further discussed with reference to FIG. 3.

As will be appreciated in light of this disclosure, correctly received means that the divide word 236 is received without clock domain crossing timing violations. If the divider 220 fails to receive this word correctly, it will divide by a wrong value and the PLL 200 may fail to lock entirely. In contrast to the DSM 124 of FIG. 1, which is clocked by the output of the divider 120, in this example embodiment shown in FIG. 2 the DSM 224 is directly clocked by the reference frequency 212. The DSM 224 includes multiple accumulators, also referred to in this disclosure as stages, according to some embodiments. In other embodiments, the DSM 224 can be implemented with conventional technology or a custom or proprietary architecture, if so desired. While the integer divide control number 230 (IDIV) controls integer based switching of divider 220, the fractional divide control number 226 (FDIV) controls the switching of divider 220 between at least two different frequencies so as to be able to control the average of the frequencies in terms of a controllable duty cycle. The frequency of the signal 218 output by the PLL 200 can be finely controlled by adjusting the duty cycle. For example, fine frequency control may be obtained by adding the fractional divide control number to the count in the accumulator of the DSM 224 for the duty cycle.

In operation, PLL 200 uses the reference frequency 212, which is the desired PLL output frequency divided by N. The VCO 216 generates the synthesized output frequency 218. If the reference frequency 212 and the PLL output 218 divided by N are the same frequency and at the same phase, then the phase detector 210 has zero output, the VCO-controlled output frequency 218 is not changed, and the PLL phase is locked. When the reference frequency 212 and the PLL output 218 divided by N are different, either having the same frequency but a different phase, or are at different frequencies, the phase detector 210 output controls VCO 216 to either speed up and increase the PLL output frequency 218 or slow down to decrease the PLL output frequency 218. The VCO 216 is thus adjusted via the phase detector 210, until the reference frequency 212 and PLL output 218 divided by N are locked in both frequency and phase.

In some embodiments, a frequency control word (FCW) (e.g., the fractional divide control number 226 and/or integer divide control number 230) can be used to change a frequency in the phase coherent fractional-N PLL 200. The fractional portion of the FCW is a binary number that is added to accumulators of the DSM 224 to control a divide ratio in an analog or digital fractional-N phase-locked loop such that a phase of the synthesized frequency is deterministic from a given point in time with respect to the reference signal. The result of applying the FCW binary number to the DSM 224 (including the summer on the output of the DSM 224, that receives the integer portion of the FCW) is an output word 232 (the divide ratio) that controls the switching between states of the PLL 200 to vary the average output frequency 218 via the divider 220. The result is that the PLL output 218 is a signal whose frequency may be altered between, for example, two frequencies associated with two multipliers in the DSM 224. As will be appreciated in light of this disclosure, the techniques can be applied to any application where a data bus crosses a clock domain boundary, and are not limited to just PLL applications.

Retime Word Circuit

As will be appreciated in light of this disclosure, a retime word circuit is not needed in a conventional fractional-N PLL (such as shown in FIG. 1), as the delta-sigma modulator (DSM) is clocked by $f_{DIV}$ and is therefore already synchronized to the divide-by-N integer divider. In contrast, in a phase coherent fractional-N configured as shown in in the example embodiment of FIG. 2, the DSM is clocked by $f_{REF}$, which is not synchronized to $f_{DIV}$. Thus, if the divide word provided to the divide-by-N integer divider is changed at the wrong time, an erroneous divide word results. The retime word circuit of FIGS. 2 and 3 can be used to fix the timing so that the divide word only changes at a proper time (e.g., at the end of a divide cycle), according to an embodiment of the present disclosure.

Figure 3:
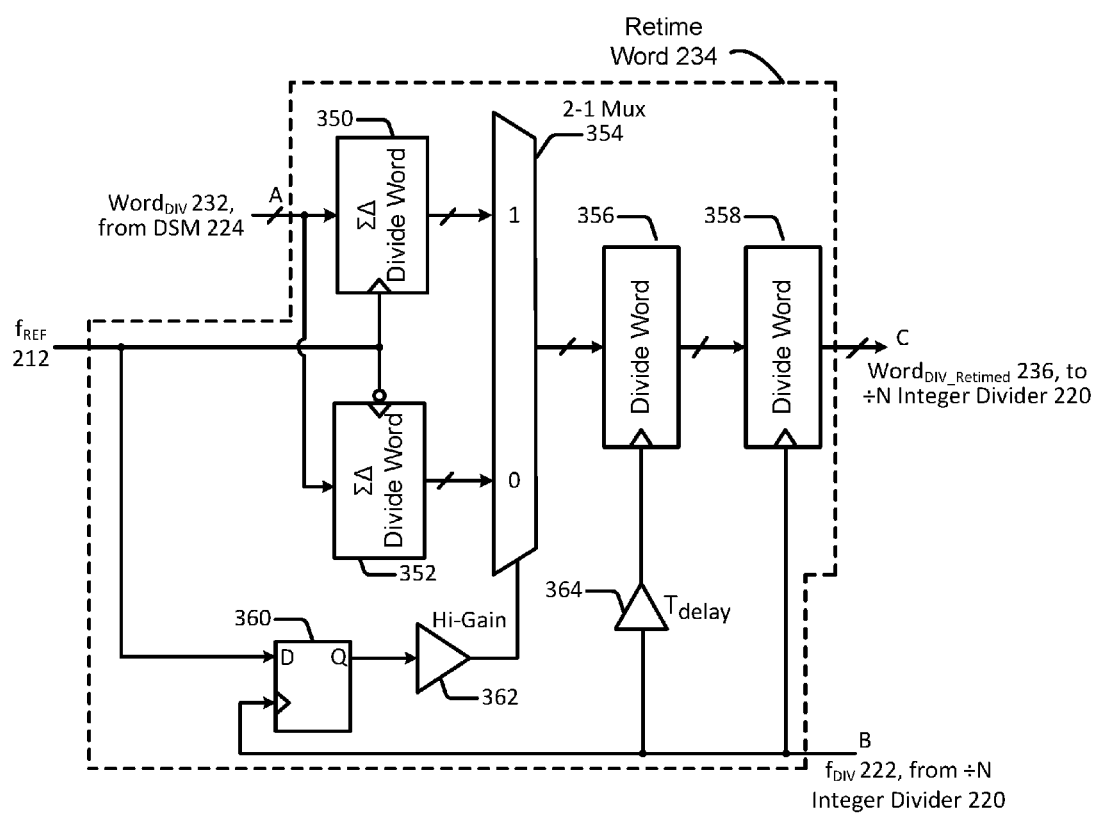
FIG. 3 illustrates a block diagram of an example retime word circuit configured in accordance with an embodiment of the present disclosure.

FIG. 3 illustrates a block diagram of an example retime word circuit 234 configured in accordance with an embodiment of the present disclosure. As can be seen, circuit 234 includes two sets of divide word registers ($1^{st}$ set being ΣΔ divide word registers 350 and 352, and $2^{nd}$ set being divide word registers 356 and 358), a two-to-one multiplexer (354), a D-type flip-flop (DFF) 360, a high-gain amplifier 362, and a time delay circuit 364. The retime word circuit 234 receives three inputs, including a reference clock $f_{REF}$ 212, along with $Word_{Div}$ 232 (at node A, from DSM 224) and a divided clock $f_{DIV}$ 222 (at node B, divide-by-N integer divider 220). The output of the retime word circuit 234 in this example case is $Word_{Div\_Retimed}$ 236 (at node C, to divider 220). Other embodiments may have additional inputs and/or outputs, such as an input of FDIV 226 and IDIV 230 (e.g., for determining correct divider) and/or a pass-thru output of $f_{REF}$ 212 (e.g., for use by another stage).

As can be seen, the register banks 350 and 352 capture data from the DSM 224. In operation, register bank 350 captures at the rising edge of the reference clock $f_{REF}$ 212, and register bank 352 captures at the falling edge of the reference clock $f_{REF}$ 212. For purposes of discussion, assume that the data of the DSM 224 changes at the rising edge of the reference clock $f_{REF}$ 212. Other embodiments may be configured such that the DSM 224 changes at the falling edge of the reference clock $f_{REF}$ 212. In such cases, an extra bank of registers could be added immediately after the DSM 224 to fix the timing, as will be appreciated in light of this disclosure. It is further assumed that the reference clock is at or otherwise sufficiently close to a 50% duty cycle (e.g., such as a duty cycle in the range of 40% to 60%, or 45% to 55%, or 45% to 52%, or 48% to 52%, or 48% to 54%, or some other suitable tolerance; note that the tolerance need not be symmetrical about 50%).

A D-type flip-flop (DFF) 360 is used to sample the state of the reference clock $f_{REF}$ 212, and the output of the DFF 360 is amplified by amplifier 362 and used to drive the select line of the two-to-one multiplexer 354. In operation, if the DFF 360 output is a logical 1 (HI), then the positive-edge triggered capture bank 350 is selected by mux 354. This means that the reference clock $f_{REF}$ 212 leads the divided clock $f_{DIV}$ 222, so that a HI is clocked in to the select input of the mux 354 via the amplifier 362. This is the correct selection because the negative-edge triggered bank 352 could change at any time and thus cause an erroneous divider. On the other hand, if the DFF 360 output is a logical 0 (LOW), then the negative-edge triggered capture bank 352 is selected by mux 354. This means that the reference clock $f_{REF}$ 212 lags the divided clock $f_{DIV}$ 222, so that a LOW is clocked in to the select input of the mux 354 via the amplifier 362. This is the correct selection because the positive-edge triggered bank 350 could change at any time and thus cause an erroneous divider. Thus, as long as one of the reference clock $f_{REF}$ 212 or divided clock $f_{DIV}$ 222 leads (or lags, as the case may be), then the DFF 360 can effectively pick the correct bank for the capture event.

The trickier case is when the reference clock $f_{REF}$ 212 and divided clock $f_{DIV}$ 222 phase match, which causes a meta-stable event in the DFF 360. This is where the high gain buffer 362 comes into play. In more detail, the high gain buffer (or amplifier) 362 amplifies the output of DFF 360 to force a meta-stable event to a logic rail (e.g., CMOS logic rail of HI or LOW, although other process technology may be used). As is known, when a meta-stable event occurs, the output voltage of a DFF is anywhere between a LOW and a HI. In such cases, it is difficult to know which capture bank (350 or 352) triggered. Note, however, that because the meta-stable event generally will only happen when the reference clock $f_{REF}$ 212 is substantially phase-matched to the divided clock $f_{DIV}$ 222, the selection of either bank 350 or 352 will be ok (because, in such cases, the difference between a positive-edge triggered capture event and a negative-edge triggered capture event is sufficiently small or otherwise negligible). Thus, the high gain amp 362 is used to render a predictable HI or LOW signal during a meta-stable event of a given system. Note that this effective declaration by the amp 362 takes into consideration factors of the given system, such as process technology (e.g., CMOS, ECL, etc) and environmental conditions (e.g., temperature, parasitics, etc) that may impact the meta-stable output value received by the amp 362. In any case, it doesn't really matter whether the amplifier 362 forces a HI or LOW during a meta-stable event—so long as it forces a capture event is all that matters. Other embodiments may use, for example, voting logic and multiple DFFs to make a more robust decision and eliminate the ambiguity created by meta-stability events, if so desired. Any such configurations can be used in conjunction with the techniques provided herein, as will be appreciated.

So, according to one example embodiment, the retime word circuit 234 operates to avoid picking the data from register 350 when the reference clock $f_{REF}$ 212 is LOW, since at any time the reference clock $f_{REF}$ 212 could go high and corrupt the register 350 output with data switching. Similarly, the retime word circuit 234 operates to avoid picking the data from register 352 when the reference clock $f_{REF}$ 212 is HI, since at any time the reference clock $f_{REF}$ 212 could go low and corrupt the register 352 output with data switching. Reversing the negative logic, the retime word circuit 234 operates to pick the data from register 350 when the reference clock $f_{REF}$ 212 is HI, and pick the data from the register 352 when the reference clock $f_{REF}$ 212 is LOW. As will be further appreciated in light of this disclosure, DFF 360 serves as a bang-bang phase detector used to pick one of the data register banks (sigma-delta divide word register 350 or 352) that will be stable for at least a half clock cycle. The mux 354 picks the winning register bank 350 or 352, based on the rising or falling edge capture, as detected by DFF 360 and reported by amp 362. The content of winning register bank (either 350 or 352) is then clocked to the initial output register bank 356 via the mux 354. The contents of register bank 356 are then clocked into output register bank 358. As can be further seen, the output register bank 358 provides the output of the retime word circuit 234, which is the retimed version of the divider word $Word_{DIV}$ 232 and is referred to as $Word_{Div\_Retimed}$ 236, at node C. $Word_{Div\_Retimed}$ 236 can be applied to the divider 220. Tdelay 364 delays this transfer from 356 to 358, to allow for set-up.

In more detail, if the reference clock $f_{REF}$ 212 and divided clock $f_{DIV}$ 222 are at such a phase that the DFF 360 goes into a meta-stable region, then it can be assumed that a capture event has just occurred (although it is not known which one). By adding a sufficient delay on the divided clock line ($f_{DIV}$ 222) to the divide word capture bank 356, the set-up time available for that bank 356 can be determined by $t_{ref}/2-t_{del}$. For reasonable reference clock frequencies (e.g., 10 KHz to 100 GHz), such delay should be sufficient. In a more general sense, the delay on the divided clock line can be tailored to a given range of clock frequencies. In some example cases, the delay can be determined through empirical testing using a set of known test parameters (e.g., $f_{REF}$, $f_{DIV}$, $Word_{Div}$, and retimed $Word_{Div}$).

Numerous variations will be apparent, and the specific logical arrangement shown in FIG. 3 is not intended to limit the present disclosure. Rather, other variations and circuits configured to provide the equivalent logical function can be used. For instance, DFF 360 can be implemented by clockable registers or gate-level logic, as well as commercially available flip-flop circuits. To this end, reference to DFF or D-type flip-flop herein is intended to include all hardware variations that achieve the same result as provided herein. Likewise, amp 362 and delay buffer 364 can be implemented with transistor arrangements as well as commercially available logic gates, or combinations thereof configured to provide comparable functionality. The register banks 350, 352, 356, and 358 can be implemented with any suitable clockable or push memory. In addition, the techniques may be used for any data bus crossing a clock domain boundary, not just a sigma-delta data bus in a PLL.

Further Example Embodiments

The following examples pertain to further embodiments, from which numerous permutations and configurations will be apparent.

Example 1 is a retiming circuit comprising: a clocked circuit for providing data in response to a reference clock, the reference clock having a rising edge and a falling edge; a positive-edge triggered capture register to capture data from the clocked circuit at the rising edge of the reference clock; a negative-edge triggered capture register to capture data from the clocked circuit at the falling edge of the reference clock; and a selection circuit to sample the state of the reference clock and a second clock that is asynchronous to the reference clock, and select one of the positive-edge triggered capture register and the negative-edge triggered capture register based on the sampling; wherein data from the selected register is clocked to an output of the retiming circuit. In some such embodiments, the output of the retiming circuit is a control word for a divide-by-N frequency divider of a DSM PLL, so some other such control signal or set of signals. Other embodiments need not be related to frequency division control of a PLL divider. For instance, in another embodiment the output of the retiming circuit is a control word, signal, or set of signals useable for managing the timing between two asynchronous clocks, or for synchronizing a data bus across a clock boundary in a system-on-chip (SOC) or field programmable gate array (FPGA) application.

Example 2 includes the subject matter of Example 1, and further includes an amplifier for forcing a selection output signal of the selection circuit to be one of logical high or logical low during a meta-stable event. A meta-stable event may be caused, for example, by the reference clock and second clock being substantially within phase with each other, within a given tolerance (e.g., +/−5 degrees, or +/−4 degrees, or +/−3 degrees, or +/−2 degrees, or +/−1 degrees, or +/−0.5 degrees).

Example 3 includes the subject matter of Example 1 or 2, wherein the selection circuit includes a D-type flip-flop that samples the reference clock and the second clock, and further includes a multiplexer to receive output from each of the positive-edge triggered capture register and the negative-edge triggered capture register and forward one of those outputs in response to a selection output signal from the flip-flop. Note that the flip-flop may be implemented with, for example, off-the-shelf flip-flop integrated circuit chips (e.g., 54/74FCT374 by Texas Instruments, 74F377 or CD4013BC by Fairchild Semiconductor, or 54F/74F74 by National Semiconductor), or discrete componentry arranged to provide D-type flip-flop functionality, or a custom circuit arranged to provide D-type flip-flop functionality. Any number of suitable configurations can be used, and all such configurations are intended to be covered under the term flip-flop or flip-flop circuit. D-type flip-flops are particularly useful, according to some embodiments, but other types of flip-flops that can be configured to provide comparable functionality (e.g., S-R flip-flop with configured to receive the same input except that the R-input is inverted). The multiplexer may be, for instance, an off-the-shelf multiplexer integrated circuit (e.g., CY74FCT258T by Texas Instruments), or discrete componentry arranged to provide multiplexer functionality, or a custom circuit arranged to provide multiplexer functionality. Any number of configurations can be used.

Example 4 includes the subject matter of any of the preceding Examples, and further includes a first output register to receive data output from a selected one of the positive-edge triggered capture register and the negative-edge triggered capture register, wherein the first output register is clocked by the second clock.

Example 5 includes the subject matter of Example 4, and further includes a second output register to receive data output from the first register, wherein the second output register is clocked by the second clock.

Example 6 includes the subject matter of Example 4 or 5, and further includes a delay circuit operatively coupled to the first output register, wherein the delay circuit delays application of the second clock to the first output register.

Example 7 includes the subject matter of any of the preceding Examples, wherein the circuit is part of a phase coherent fractional N phase locked loop (PLL) circuit.

Example 8 includes the subject matter of any of the preceding Examples, wherein the reference clock has a duty cycle in the range of 45% to 55%.

Example 9 is a retiming circuit for a phase coherent fractional N phase locked loop (PLL), the circuit comprising: a clocked circuit for providing data in response to a reference clock, the reference clock having a rising edge and a falling edge; a positive-edge triggered capture register to capture data from the clocked circuit at the rising edge of the reference clock; a negative-edge triggered capture register to capture data from the clocked circuit at the falling edge of the reference clock; and a flip-flop circuit to sample the state of the reference clock and a second clock that is asynchronous to the reference clock, and select one of the positive-edge triggered capture register and the negative-edge triggered capture register based on the sampling; wherein data from the selected register is clocked to an output of the retiming circuit, the output operatively coupled to a control word input of a frequency divider included in the PLL.

Example 10 includes the subject matter of Example 9, and further includes an amplifier for forcing a selection output signal of the flip-flop circuit to be one of logical high or logical low during a meta-stable event.

Example 11 includes the subject matter of Example 9 or 10, and further includes a multiplexer to receive output from each of the positive-edge triggered capture register and the negative-edge triggered capture register and forward one of those outputs in response to a selection output signal from the flip-flop circuit.

Example 12 includes the subject matter of any of Examples 9 through 11, and further includes a first output register to receive data output from a selected one of the positive-edge triggered capture register and the negative-edge triggered capture register, wherein the first output register is clocked by the second clock.

Example 13 includes the subject matter of Example 12, and further includes a second output register to receive data output from the first register, wherein the second output register is clocked by the second clock.

Example 14 includes the subject matter of Example 12 or 13, and further includes a delay circuit operatively coupled to the first output register, wherein the delay circuit delays application of the second clock to the first output register.

Example 15 includes the subject matter of any of Examples 9 through 14, wherein the reference clock has a duty cycle in the range of 45% to 55%.

Example 16 is a retiming circuit for a phase coherent fractional N phase locked loop (PLL), the circuit comprising: a clocked circuit for providing data in response to a reference clock, the reference clock having a rising edge and a falling edge; a positive-edge triggered capture register to capture data from the clocked circuit at the rising edge of the reference clock; a negative-edge triggered capture register to capture data from the clocked circuit at the falling edge of the reference clock; a flip-flop circuit to sample the state of the reference clock and a second clock that is asynchronous to the reference clock, and select one of the positive-edge triggered capture register and the negative-edge triggered capture register based on the sampling; an amplifier for forcing a selection output signal of the flip-flop circuit to be one of logical high or logical low during a meta-stable event; and a multiplexer to receive output from each of the positive-edge triggered capture register and the negative-edge triggered capture register and forward one of those outputs in response to a selection output signal from the flip-flop circuit; wherein data from the selected register is clocked to an output of the retiming circuit, the output operatively coupled to a control word input of a frequency divider included in the PLL.

Example 17 includes the subject matter of Example 16, and further includes a first output register to receive data output from a selected one of the positive-edge triggered capture register and the negative-edge triggered capture register, wherein the first output register is clocked by the second clock.

Example 18 includes the subject matter of Example 17, and further includes a second output register to receive data output from the first register, wherein the second output register is clocked by the second clock.

Example 19 includes the subject matter of Example 17 or 18, and further includes a delay circuit operatively coupled to the first output register, wherein the delay circuit delays application of the second clock to the first output register.

Example 20 includes the subject matter of any of Examples 16 through 19, wherein the reference clock has a duty cycle in the range of 45% to 55%.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

What is claimed is:

1. A retiming circuit comprising:
   a clocked circuit for providing data in response to a reference clock, the reference clock having a rising edge and a falling edge;
   a positive-edge triggered capture register to capture data from the clocked circuit at the rising edge of the reference clock;
   a negative-edge triggered capture register to capture data from the clocked circuit at the falling edge of the reference clock;
   a selection circuit to sample the state of the reference clock and a second clock that is asynchronous to the reference clock, and select one of the positive-edge triggered capture register and the negative-edge triggered capture register based on the sampling;
   a first output register to receive data output from a selected one of the positive-edge triggered capture register and the negative-edge triggered capture register, wherein the first output register is clocked by the second clock; and
   a delay circuit operatively coupled to the first output register, wherein the delay circuit delays application of the second clock to the first output register;
   wherein data from the selected register is clocked to an output of the retiming circuit.

2. The circuit of claim 1 further including an amplifier for forcing a selection output signal of the selection circuit to be one of logical high or logical low during a meta-stable event.

3. The circuit of claim 1 wherein the selection circuit includes a D-type flip-flop that samples the reference clock and the second clock, and further includes a multiplexer to receive output from each of the positive-edge triggered capture register and the negative-edge triggered capture register and forward one of those outputs in response to a selection output signal from the flip-flop.

4. The circuit of claim 1 further comprising a second output register to receive data output from the first register, wherein the second output register is clocked by the second clock.

5. The circuit of claim 1 wherein the circuit is part of a phase coherent fractional N phase locked loop (PLL) circuit.

6. The circuit of claim 1 wherein the reference clock has a duty cycle in the range of 45% to 55%.

7. A retiming circuit for a phase coherent fractional N phase locked loop (PLL), the circuit comprising:
   a clocked circuit for providing data in response to a reference clock, the reference clock having a rising edge and a falling edge;
   a positive-edge triggered capture register to capture data from the clocked circuit at the rising edge of the reference clock;
   a negative-edge triggered capture register to capture data from the clocked circuit at the falling edge of the reference clock; and
   a flip-flop circuit to sample the state of the reference clock and a second clock that is asynchronous to the reference clock, and select one of the positive-edge triggered capture register and the negative-edge triggered capture register based on the sampling;
   wherein data from the selected register is clocked to an output of the retiming circuit, the output operatively coupled to a control word input of a frequency divider included in the PLL.

8. The circuit of claim 7 further including an amplifier for forcing a selection output signal of the flip-flop circuit to be one of logical high or logical low during a meta-stable event.

9. The circuit of claim 7 further including a multiplexer to receive output from each of the positive-edge triggered capture register and the negative-edge triggered capture register and forward one of those outputs in response to a selection output signal from the flip-flop circuit.

10. The circuit of claim 7 further comprising a first output register to receive data output from a selected one of the positive-edge triggered capture register and the negative-edge triggered capture register, wherein the first output register is clocked by the second clock.

11. The circuit of claim 10 further comprising a second output register to receive data output from the first register, wherein the second output register is clocked by the second clock.

12. The circuit of claim 10 further comprising a delay circuit operatively coupled to the first output register, wherein the delay circuit delays application of the second clock to the first output register.

13. The circuit of claim 7 wherein the reference clock has a duty cycle in the range of 45% to 55%.

14. A retiming circuit for a phase coherent fractional N phase locked loop (PLL), the circuit comprising:
    a clocked circuit for providing data in response to a reference clock, the reference clock having a rising edge and a falling edge;
    a positive-edge triggered capture register to capture data from the clocked circuit at the rising edge of the reference clock;
    a negative-edge triggered capture register to capture data from the clocked circuit at the falling edge of the reference clock;
    a flip-flop circuit to sample the state of the reference clock and a second clock that is asynchronous to the reference clock, and select one of the positive-edge triggered capture register and the negative-edge triggered capture register based on the sampling;
    an amplifier for forcing a selection output signal of the flip-flop circuit to be one of logical high or logical low during a meta-stable event; and
    a multiplexer to receive output from each of the positive-edge triggered capture register and the negative-edge triggered capture register and forward one of those outputs in response to a selection output signal from the flip-flop circuit;
    wherein data from the selected register is clocked to an output of the retiming circuit, the output operatively coupled to a control word input of a frequency divider included in the PLL.

15. The circuit of claim 14 further comprising a first output register to receive data output from a selected one of the positive-edge triggered capture register and the negative-edge triggered capture register, wherein the first output register is clocked by the second clock.

16. The circuit of claim 15 further comprising a second output register to receive data output from the first register, wherein the second output register is clocked by the second clock.

17. The circuit of claim 15 further comprising a delay circuit operatively coupled to the first output register, wherein the delay circuit delays application of the second clock to the first output register.

18. The circuit of claim 14 wherein the reference clock has a duty cycle in the range of 45% to 55%.

* * * * *